United States Patent
Ohta et al.

(10) Patent No.: US 9,237,283 B2
(45) Date of Patent: *Jan. 12, 2016

(54) SOLID-STATE IMAGE PICKUP DEVICE

(71) Applicant: KABUSHIKI KAISHA TOSHIBA, Minato-ku (JP)

(72) Inventors: Atsushi Ohta, Oita (JP); Hitohisa Ono, Oita (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/341,455

(22) Filed: Jul. 25, 2014

(65) Prior Publication Data
US 2014/0333807 A1 Nov. 13, 2014

Related U.S. Application Data

(62) Division of application No. 13/896,568, filed on May 17, 2013, now Pat. No. 8,803,204.

(30) Foreign Application Priority Data

Feb. 4, 2013 (JP) ................. 2013-019632

(51) Int. Cl.
*H01L 27/148* (2006.01)
*H01L 27/146* (2006.01)
*H04N 5/361* (2011.01)
*H04N 5/374* (2011.01)

(52) U.S. Cl.
CPC ............ *H04N 5/361* (2013.01); *H01L 27/1461* (2013.01); *H01L 27/14601* (2013.01); *H01L 27/14621* (2013.01); *H01L 27/14623* (2013.01);

(Continued)

(58) Field of Classification Search
CPC ... H01L 27/14643; H04N 5/347; H04N 5/361
USPC .......................................... 257/231; 348/294
See application file for complete search history.

(56) References Cited

U.S. PATENT DOCUMENTS

| 2010/0155787 | A1* | 6/2010 | Koizumi et al. ............... 257/222 |
| 2010/0181602 | A1* | 7/2010 | Oishi ............................ 257/225 |
| 2010/0243864 | A1  | 9/2010 | Itonaga |

(Continued)

FOREIGN PATENT DOCUMENTS

| JP | 2004-179473 | 6/2004 |
| JP | 2005-223019 | 8/2005 |

(Continued)

*Primary Examiner* — Julio J Maldonado
*Assistant Examiner* — Moazzam Hossain
(74) *Attorney, Agent, or Firm* — Oblon, McClelland, Maier & Neustadt, L.L.P.

(57) ABSTRACT

In a manufacturing method of a solid-state image pickup device according to an embodiment, a transfer gate electrode is formed in a predetermined position on an upper surface of a first conductive semiconductor area, through a gate insulating film. A second conductive charge storage area is formed in an area adjacent to the transfer gate electrode in the first conductive semiconductor area. A sidewall is formed on a side surface of the transfer gate electrode. An insulating film is formed to extend from a circumference surface of the sidewall on a side of the charge storage area to a position partially covering the upper part of the charge storage area. A first conductive charge storage layer is formed in the charge storage area by implanting first conductive impurities from above, into the charge storage area which is partially covered with the insulating film.

11 Claims, 9 Drawing Sheets

(52) U.S. Cl.
CPC .......... *H01L 27/14689* (2013.01); *H04N 5/374* (2013.01); *H01L 27/14603* (2013.01)

(56) References Cited

U.S. PATENT DOCUMENTS

2010/0308384 A1  12/2010  Tsuno et al.
2011/0127408 A1*  6/2011  Yanagita et al. ........... 250/208.1
2012/0199893 A1*  8/2012  Okabe et al. .................. 257/291

FOREIGN PATENT DOCUMENTS

| JP | 2007-88305 | 4/2007 |
| JP | 2010-56245 | 3/2010 |
| JP | 2010-239075 | 10/2010 |
| JP | 2010-287610 | 12/2010 |

* cited by examiner

SOLID-STATE IMAGE PICKUP DEVICE

CROSS-REFERENCE TO RELATED APPLICATION

This divisional application claims the benefit of priority under 35 U.S.C. §120 from prior U.S. patent application Ser. No. 13/896,568, filed on May 17, 2013. This application is also based upon and claims the benefit of priority under 35 U.S.C. §119 from Japanese Patent Application No. 2013-019632, filed on Feb. 4, 2013, the entire contents of each of which are incorporated herein by reference.

FIELD

An embodiment described herein relates generally to a manufacturing method of a solid-state image pickup device and the solid-state image pickup device.

BACKGROUND

Conventionally, in solid-state image pickup devices, electrons which are excited regardless of incident light may sometimes be a dark current and read out, due to crystal defect or metal contamination on the light receiving surface of a photodiode. This dark current causes white defects appearing in a picked-up image.

Thus, according to an applicable method, in a step of manufacturing the solid-state image pickup device, the dark current is reduced by storing positive holes through ion implantation into the part of the light-receiving surface of the photodiode, and rejoining electrons excited regardless of incident light and positive holes.

However, when there is an increased amount of positive holes stored in the light receiving surface part of the photodiode, it is difficult to read the photoelectrically-converted electrons from the photodiode. This results in a problem that some electrons without being read and remaining in the photodiode cause so-called afterimages.

DETAILED DESCRIPTION

According to one embodiment of the present invention, there is provided a manufacturing method of a solid-state image pickup device. In the manufacturing method of a solid-state image pickup device, a transfer gate electrode, which transfer charges that are photoelectrically converted by a photoelectric conversion device to a floating diffusion area, is formed in a predetermined position on the upper surface of a first conductive semiconductor area through a gate insulating film. A second conductive charge storage area for storing the charges photoelectrically converted by the photoelectric conversion area is formed in an area adjacent to the transfer gate electrode in the first conductive semiconductor area. A sidewall is formed on the side surface of the transfer gate electrode. An insulating film is formed to extend from the circumference surface of the sidewall on the side of the charge storage area to a position partially covering the upper part of the charge storage area. A first conductive charge storage layer is formed on the upper surface of the charge storage area, by implanting first conductive impurities from above to the charge storage area which is partially covered with the insulating film.

An exemplary embodiment of a manufacturing method of a solid-state image pickup device and the solid-state image pickup device will be explained below in detail with reference to the accompanying drawings. The present invention is not limited to the following embodiment.

In this embodiment, descriptions will be made to so-called a surface irradiation CMOS (Complementary Metal Oxide Semiconductor) image sensor as an example of a solid-state image pickup device. In the CMOS image sensor, wiring layer is formed on both sides of a photoelectric conversion device, onto which incident light enters and which performs photoelectric conversion on incident light.

The solid-state image pickup device according to this embodiment is not limited to the surface irradiation CMOS image sensor, and may include an arbitrary image sensor, such as so-called a back-surface irradiation CMOS image sensor, and a CCD (Charge Coupled Device) image sensor.

Figure 1:
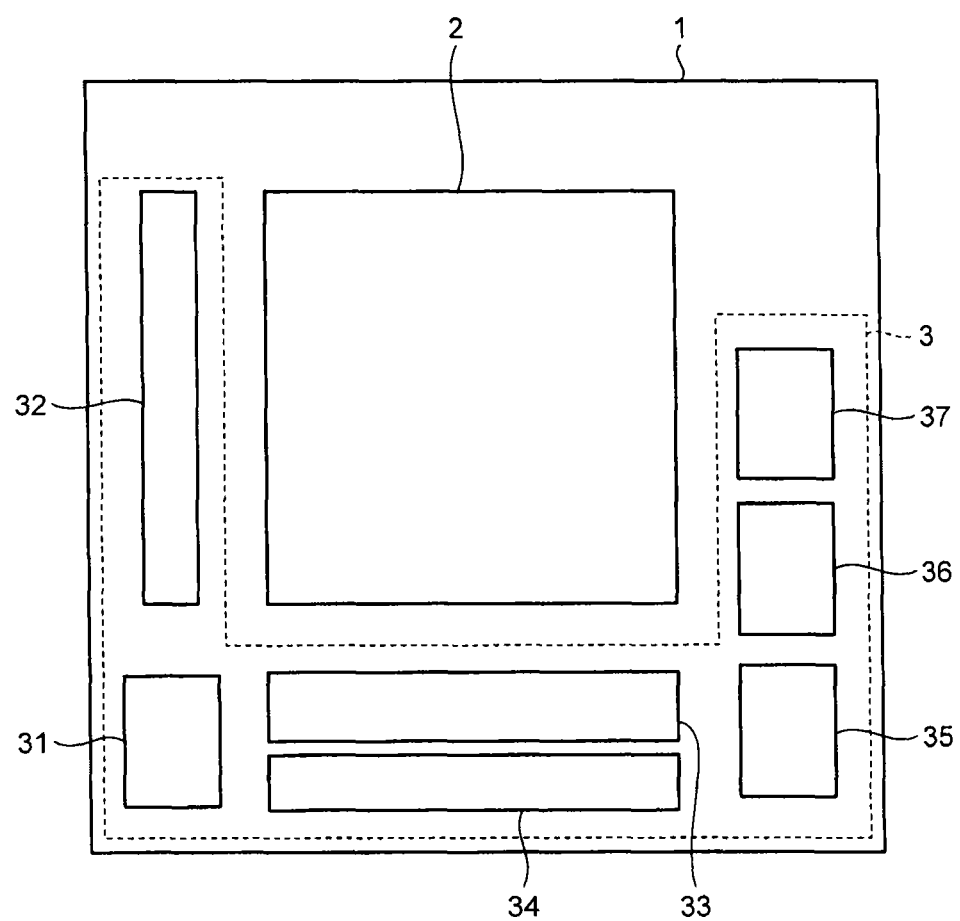
FIG. 1 is an explanatory diagram showing a top surface view of a CMOS sensor according to an embodiment.

FIG. 1 is an explanatory diagram showing a top surface view of the surface irradiation CMOS image sensor (hereinafter referred to as a CMOS sensor 1) according to the embodiment. As illustrated in FIG. 1, the CMOS sensor 1 includes a pixel unit 2 and a peripheral circuit unit 3.

The pixel unit 2 includes a plurality of photoelectric conversion devices formed in matrix. The photoelectric conversion devices convert incident light into a certain amount of electric charges (in this case, electrons) in accordance with the amount of received light (intensity of received light), and store them in a charge storage area. A configuration of the photoelectric conversion devices will specifically be described with reference to FIG. 2 and FIG. 3.

The peripheral circuit unit 3 includes an analog circuit or a logic circuit. Specifically, the peripheral circuit unit 3 includes a timing generator 31, a vertical selection circuit 32, a sampling circuit 33, a horizontal selection circuit 34, a gain control circuit 35, an A/D (analog/digital) conversion circuit 36, and an input/output circuit 37.

The timing generator 31 is a processing unit which outputs a pulse signal as an operational timing criterion, for the pixel unit 2, the vertical selection circuit 32, the sampling circuit 33, the horizontal selection circuit 34, the gain control circuit 35, the A/D conversion circuit 36, and the input/output circuit 37.

The vertical selection circuit 32 is a processing unit which sequentially selects the photoelectric conversion devices in the unit of rows. The photoelectric conversion devices read electric charges from a plurality of photoelectric conversion devices arranged in matrix. The vertical selection circuit 32 causes the photoelectric conversion devices to output the electric charges stored in the photoelectric conversion devices selected in the unit of rows to the sampling circuit 33, as pixel signals representing the brightness of each of pixels.

The sampling circuit 33 is a processing unit which removes noise from the pixel signals input from each of the photoelectric conversion devices selected in the unit of rows by the vertical selection circuit 32 using CDS (Correlated Double Sampling) and temporarily stores them.

The horizontal selection circuit 34 is a processing unit which sequentially selects and reads each row of the pixel signals stored by the sampling circuit 33 and outputs the read signals to the gain control circuit 35. The gain control circuit 35 is a processing unit which adjusts the gain of the pixel signal input from the horizontal selection circuit 34 and outputs the gain to the A/D conversion circuit 36.

The A/D conversion circuit 36 is a processing unit which converts the analog pixel signal input from the gain control circuit 35 into a digital pixel signal and outputs the signal to the input/output circuit 37. The input/output circuit 37 is a processing unit which outputs the digital signal input from the A/D conversion circuit 36 to a predetermined DSP (Digital Signal Processor (not illustrated)).

In this manner, in the CMOS sensor 1, the image pickup is performed by the plurality of photoelectric conversion devices (arranged in the pixel unit 2) performing photoelectric conversion on incident light into a certain amount of electric charges in accordance with the amount of received light and storing them, and by the peripheral circuit unit 3 reading the electric charges stored in the photoelectric conversion devices as pixel signals.

In the CMOS sensor 1, when there occurs an interface state due to crystal defect therein or when the contaminant is adhered to a side surface side (hereinafter referred to as "light receiving surface") of the photoelectric conversion devices onto which incident light enters, electrons may be excited and stored into the photoelectric conversion devices onto which incident light has not entered yet.

These electrons become a dark current and flows from the pixel unit 2 to the peripheral circuit unit 3, and may appear in the form of white defects in the picked-up image, while the pixel signals are read by the peripheral circuit unit 3. Thus, in the CMOS sensor 1 according to this embodiment, a positive hole storage layer in which positive holes are stored is included in the light receiving surface for the photoelectric conversion devices, to suppress a dark current by rejoining the electrons excited regardless of entrance of incident light with the positive holes of the positive hole storage area.

To improve the suppression characteristic of suppressing the dark current, the positive hole storage area in the photoelectric conversion devices preferably has a deep depth, and the concentration of the positive holes is preferably high. Note, however, if the positive hole storage area has a deep depth, and the concentration of the positive holes is high, it is difficult to read the electrons from the charge storage area. As a result, electrons which have not been read appear in the form of afterimages in the picked-up image.

The CMOS sensor 1 includes the pixel unit 2 which is configured to suppress both white defects and afterimages in the picked up image. The configuration of the pixel unit 2 of this embodiment will now be described with reference to FIG. 2.

Figure 2:
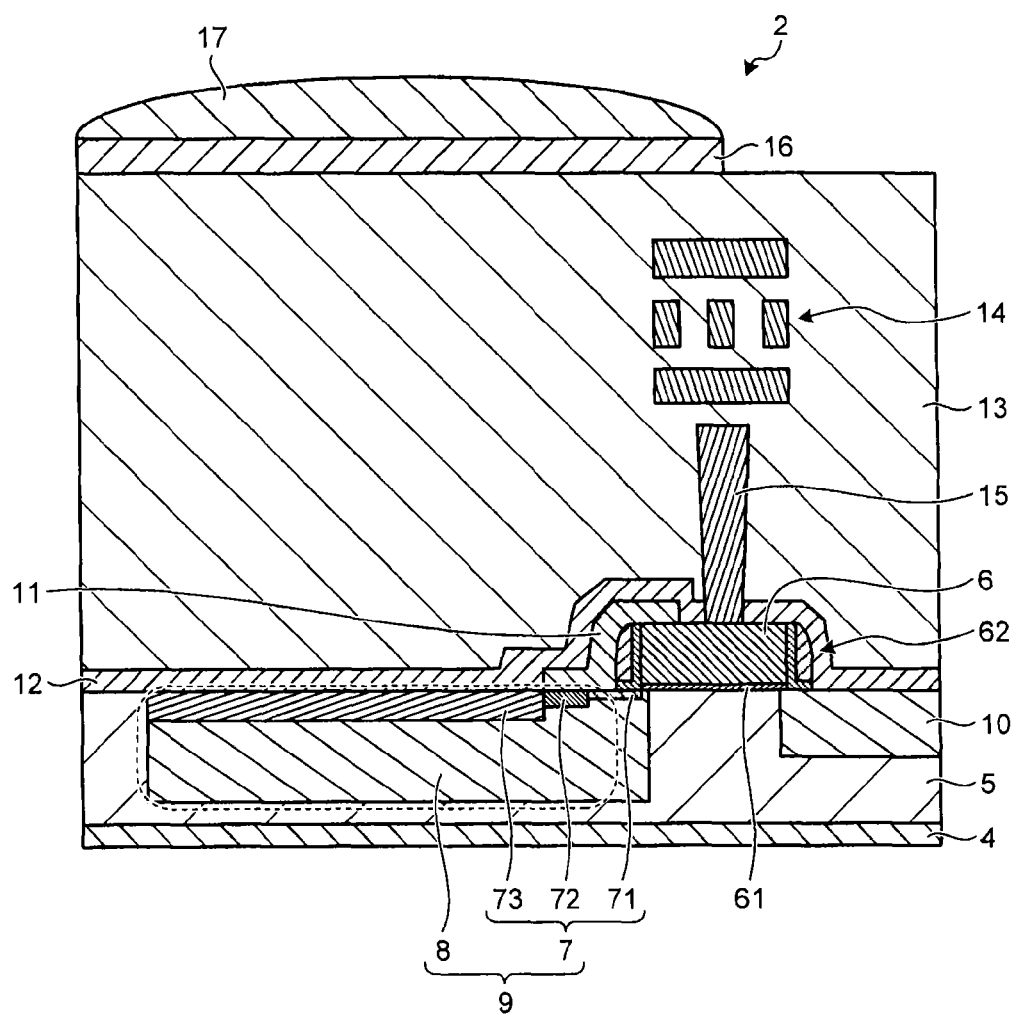
FIG. 2 is an explanatory diagram showing a section view of a part of a pixel unit according to the embodiment.

FIG. 2 is an explanatory diagram showing a section view of a part of the pixel unit 2 of this embodiment. In FIG. 2, of constituent elements included in one pixel of the pixel unit 2, those constituent elements near the photoelectric conversion device 9 and the transfer gate electrode 6 are selectively illustrated, while a reset transistor, an amplifier transistor, and an address selection transistor are not illustrated.

As illustrated in FIG. 2, each pixel part of the pixel unit 2 has a first conductive semiconductor area 5, a photoelectric conversion device 9, a floating diffusion area 10, a gate insulating film 61, a transfer gate electrode 6, a sidewall 62, and an insulating 11, on a semiconductor substrate 4. Further, each pixel part of the pixel unit 2 includes an antireflection film 12, an interlayer insulating film 13, multilayer wiring 14, a contact plug 15, a color filter 16, and a micro lens 17.

The first conductive (hereinafter referred to as "P-type") semiconductor area 5 (hereinafter referred to as "P-well 5") is provided on the semiconductor substrate 4. The transfer gate electrode 6 (hereinafter referred to as "TG 6") is provided in a predetermined position on the upper surface of the P-well 5 through the gate insulating film 61. The sidewall 62 is provided on the side surface of the TG 6.

The photoelectric conversion device 9 is provided in an area adjacent to one side surface of the top view TG 6 in the P-well 5, as illustrated in the frame with dashed lines, and includes a second conductive (hereinafter referred to as "N-type") charge storage area 8 and a P-type semiconductor layer (hereinafter referred to as "positive hole storage layer 7") which stores positive holes. The photoelectric conversion device 9 (hereinafter referred to as "PD 9") is a photodiode which is formed with a PN junction of the charge storage area 8 and the positive hole storage layer 7. The device 9 performs photoelectric conversion on incident light from the micro lens 17 into a certain amount of electrons in accordance with the amount of light, and stores them into the charge storage area 8.

The positive hole storage layer 7 includes a first P-type layer 71, a second P-type layer 72, and a third P-type layer 73, which have different depths in depth directions from the upper surface to the semiconductor substrate 4 and different concentrations of P-type impurities therebetween. The first P-type layer 71 is provided in the nearest position to the TG 6 in the positive hole storage layer 7, has the shallowest depth in the positive hole storage layer 7, and has the lowest concentration of the P-type impurities.

The second P-type layer 72 is provided in the second nearest position to the TG 6, after the first P-type layer 71 in the positive hole storage layer 7, has the second deepest depth in the positive hole storage layer 7, and has the second highest concentration of the P-type impurities. The third P-type layer 73 is provided in the farthest position from the TG 6 in the positive hole storage layer 7, has the deepest depth in the positive hole storage layer 7, and has the highest concentration of the P-type impurities.

This results from particular introduction of the P-type impurities. Specifically, after the first P-type layer 71 is formed by introducing the P-type impurities to the upper surface of the charge storage area 8 before the position hole storage layer 7 is formed, the P-type impurities are introduced at an energy level higher than the above introduction to the first P-type layer 71 which is partially covered with the sidewall 62 and the insulating film 11. Then, the second P-type layer 72 and the third P-type layer 73 are simultaneously formed to have the depths illustrated in FIG. 2. This manufacturing method will more specifically be described with reference to FIGS. 4A to 7C.

The TG 6 functions as the gate for transferring electrons from the charge storage area 8 to the floating fusion area 10, when a predetermined gate voltage is applied. The floating diffusion area 10 (hereinafter referred to as "FD 10") temporarily stores electrons transferred from the charge storage area 8.

The insulating film 11 is provided to cover the upper surface of the TG 6 on the side of the PD 9, the peripheral surface of the sidewall 62 on the side of the PD 9, and a part of the upper surface of the PD 9 on the side of the TG 6. As described above, the insulating film 11 is provided to simultaneously form the second P-type layer 72 and the third P-type layer 73 which have different concentrations of the P-type impurities and different depths.

The insulating film 11 does not necessarily cover a part of the upper surface of the TG 6 and the peripheral surface of the sidewall 62, and may extend at least to a position covering the upper part of the charge storage area 8 from the circumference surface of the sidewall 62 on the side of the top view charge storage area 8.

The antireflection film 12 is a thin film provided to cover the light receiving surface of the PD 9, the sidewall 62, and the upper surface of the TG 6, with a low photorefractive index and high light transmittance for suppressing reflection of incident light from the micro lens 17 to the PD 9. The interlayer insulating film 13 is provided on the upper surface of the antireflection film 12, and has the multilayer wiring 14 and the contact plug 15 which are embedded thereinside.

The multilayer wiring 14 is wiring for transmitting a control signal for controlling operations of the pixel unit 2 to an active device of each pixel. The contact plug 15 is a plug for applying a predetermined gate voltage to the TG 6. The color filter 16 is provided on the upper surface of the interlayer insulating film 13, and transmits either incident light of either one color from the three primary colors of read, green, and blue. The micro lens 17 is provided on the upper surface of the color filter 16, and is a plane-convex lens for condensing incident light to the PD 9.

The pixel unit 2 performs photoelectric conversion on the incident light into electrons using the PD 9, and stores the electrons as signal charges in the charge storage area 8. After this, the pixel unit 2 transfers the signal charges from the charge storage area 8 of the PD 9 to the FD 10, when a gate voltage is applied to the TG 6. The signal charges transferred to the FD 10 are amplified by a non-illustrative amplifier transistor. Further, when a non-illustrative address selection transistor is selected, the signal charges are transferred to the peripheral circuit unit 3 as pixel signals, and are used as brightness information for one pixel when the picked-up image is generated.

Figure 3:
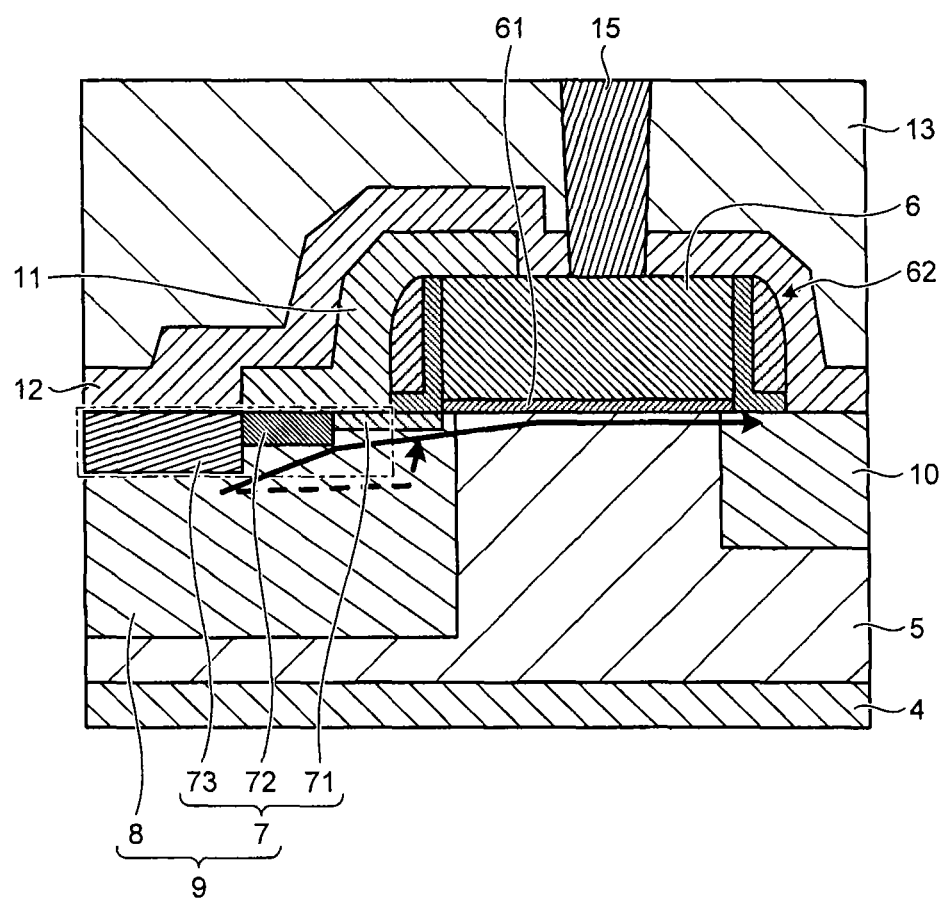
FIG. 3 is an explanatory diagram showing an enlarged view near a transfer gate electrode shown in FIG. 2.

After the first P-type layer 71 is formed in the PD 9, the pixel unit 2 forms the insulating film 11 illustrated in FIG. 2, before forming the second P-type layer 72 and the third P-type layer 73, resulting in a configuration for suppressing both the white defects and afterimages in the picked-up image. The configuration for suppressing the white defects and the afterimages will now be described with reference to FIG. 3. FIG. 3 is an explanatory diagram showing an enlarged view near the TG 6 illustrated in FIG. 2, according to this embodiment.

As illustrated in FIG. 3, the PD 9 of the pixel unit 2 includes the positive hole storage layer 7 in the upper surface part of the charge storage area 8. With this configuration, the PD 9 can rejoin the excited electrons with the positive holes of the positive hole storage layer 7, when the electrons are excited regardless of entrance of incident light by contaminant on the light receiving surface or the interface state due to crystal defect.

With the pixel unit 2, the electrons excited regardless of the entrance of incident light are suppressed from being transferred to the FD 10 in the form of a dark current. This results in suppressing the white defects in the picked up image due to the dark current.

The periphery of the positive hole storage layer 7 on the side of the TG 6 forms the insulating film 11 after forming the first P-type layer 71. After this, the second P-type layer 72 and the third P-type layer 73 are formed. As a result, the nearer to the TG 6, the shallower the depth becomes, and the lower the concentration of the P-type impurities becomes.

Before forming the second P-type layer 72 and the third P-type layer 73, if the insulating film 11 had not been formed, as illustrated with the dashed-dotted line in FIG. 3, the positive hole storage layer 7 has the same depth as that of the third P-type layer 73 and has the same concentration of the P-type impurities, in its entirety except the part right below the sidewall 62. As a result, the potential barrier increase between the channel formed right below the TG 6 and the charge storage area 8, when a gate voltage is applied to the TG 6.

When the gate voltage is applied to the TG 6, as illustrated with a dotted arrow in FIG. 3, electrons are transferred to the FD 10 through the lower layer unit of the charge storage area 8 through which the electrons are not easily moved, from the charge storage area 8 toward the channel right below the TG 6. Therefore, there occurs a phenomenon that some electrons without being transferred to the FD 10 remain in the charge storage area 8, and the electrons remaining in the charge storage area 8 are transferred to the FD 10 afterwards and appear as afterimages in the picked up image.

In the pixel unit 2, after forming the first P-type layer 71, the insulating film 11 is formed before forming the second P-type layer 72 and the third P-type layer 73, thereby attaining the shallow depth of the positive hole storage layer 7 and the low concentration of the P-type impurities, as nearer to the TG 6. In the pixel unit 2, the potential barrier can be low between the channel formed right below the TG 6 and the charge storage area 8, when the gate voltage is applied to the TG 6.

As illustrated with a solid arrow in FIG. 3, when the gate voltage is applied to the TG 6, the pixel unit 2 can transfer the electrons to the FD 10 through the upper layer unit of the charge storage area 8 through which the electrons are easily moved, from the charge storage area 8 toward the channel right below the TG 6.

According to the pixel unit 2, it is possible to avoid the phenomenon that the electrons without being transferred to the FD 10 remain in the charge storage area 8. Therefore, it is also possible to suppress that the electrons remaining in the charge storage area 8 are transferred to the FD 10 afterwards and appear as afterimages in the picked up image.

Descriptions will now be made to a manufacturing method of the CMOS sensor 1 according to this embodiment, with reference to FIGS. 4A to 7C. FIGS. 4A to 7C are explanatory diagrams showing the manufacturing method of the CMOS sensor 1 according to this embodiment. The descriptions will be made to a step of forming the part illustrated in FIG. 2, in the pixel unit 2 included in the CMOS sensor 1.

Figure 4A:
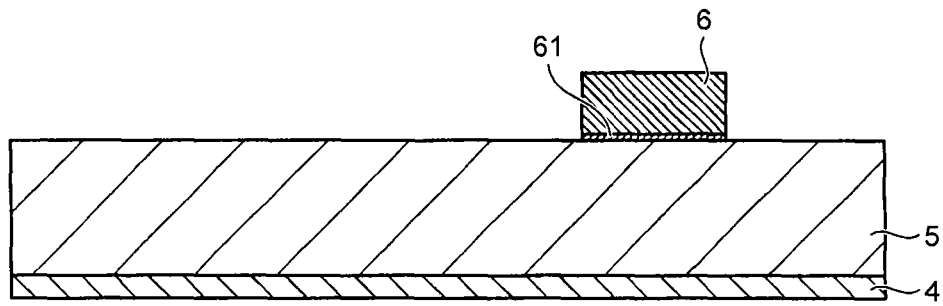
FIGS. 4A to 4c and FIGS. 5A to 5c are explanatory diagrams showing a manufacturing method of the CMOS sensor according to the embodiment.

In the manufacturing method of the CMOS sensor 1 according to this embodiment, as illustrated in FIG. 4A, the P-type P-well 5 is formed on the upper surface of the semiconductor substrate 4, for example, a silicon wafer. To form the P-well 5, P-type impurities (for example, B (boron)) are implanted into a position for forming the P-well 5 of the semiconductor substrate 4, thereafter performing an annealing process thereon. The P-well 5 may be formed by forming a hole in the formation position for the P-well 5 of the semiconductor substrate 4, and by performing an epitaxial growth process for a P-type silicon layer in the hole.

Subsequently, the TG 6 is formed through the gate insulating film 6 in a predetermined position on the upper surface of the P-well 5. Specifically, a thin silicon oxide film with a thickness of approximately 5 nm is formed on the upper surface of the P-well 5, and a polysilicon layer with a thickness of approximately 150 nm is formed on the upper surface of the silicon oxide film. Then, using a photolithography/etching process, any unnecessary parts of the polysilicon layer and the silicon oxide film are removed therefrom, to form the gate insulating film 61 and the TG 6.

Figure 4B:
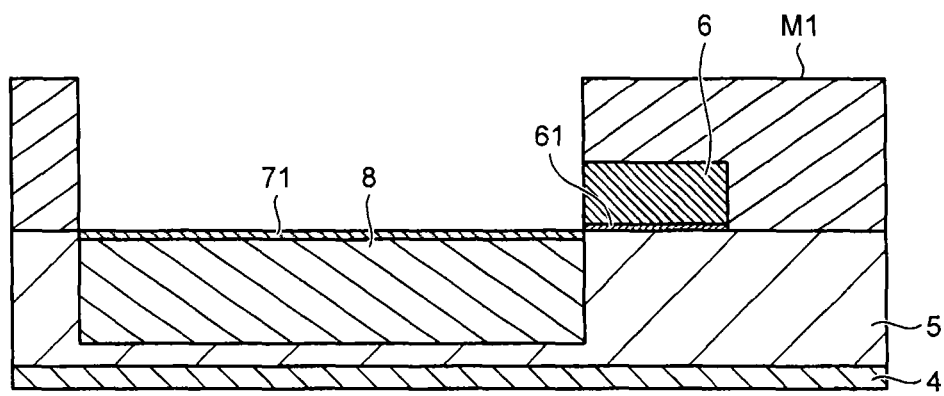

As illustrated in FIG. 4B, the charge storage area 8 and the first P-type layer 71 are formed in a position for forming the PD 9 in the P-well 5. Specifically, a resist M1 is formed on a part excluding a predetermined area adjacent to one side surface of the TG 6 in the top view and on the upper surface of the TG 6, of the upper surface of the P-well 5. N-type impurities (for example, P (phosphorus)) are implanted into the P-well, as the resist M1. Then, after P-type impurities are implanted into the P-well 5, using the resist M1 as a mask, an annealing process is performed. As a result, the charge storage area 8 and the first P-type layer 71 are formed.

Figure 4C:
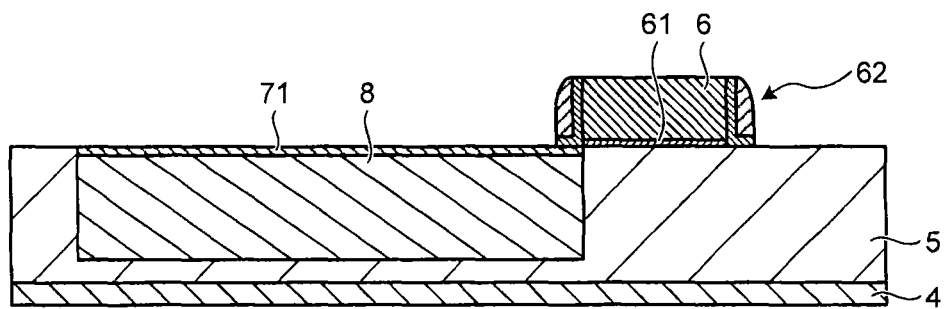

Subsequently, after separating the resist M1 therefrom, as illustrated in FIG. 4C, the sidewall 62 is formed on the side surface of the TG 6. For example, after separating the resist M1 from the structure illustrated in FIG. 4B, a silicon oxide film and a silicon nitride film are sequentially formed on the entire surface of the structure. Then, etching back is performed in accordance with RIE (Reactive Ion Etching), thereby forming the sidewall 62.

Figure 5A:
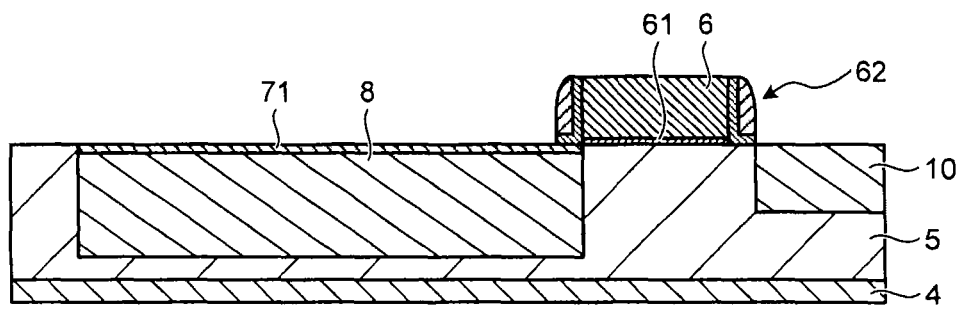

Subsequently, as illustrated in FIG. 5A, the FD 10 is formed in an area opposed to the charge storage area 8 across the TG 6 of the P-well 5 in the top view. This FF 10 is formed in accordance with the same method as for the charge storage area 8.

Figure 6A:
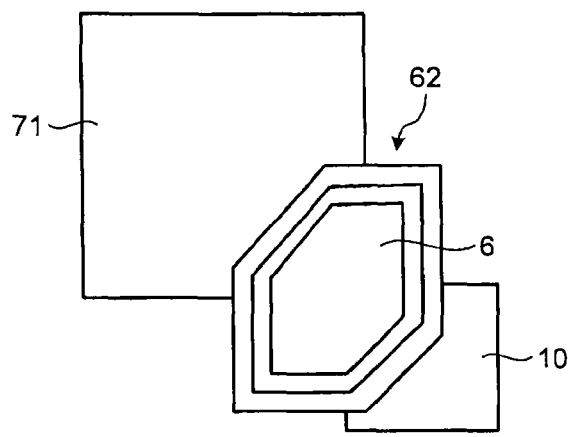
FIGS. 6A to 6c are explanatory diagrams showing a top surface view of a manufacturing method of the CMOS sensor according to the embodiment.

For example, of the upper surface of the structure illustrated in FIG. 4C, the part excluding the position for forming the FD 10 is covered with the resist. After the N-type impurities are implanted using the resist as a mask, the resist is separated therefrom, and an annealing process is performed, thereby forming the FD 10. As a result, as illustrated in FIG. 6A, the first P-type layer 71 and the FD 10 are formed in positions opposed to each other across the TG 6 in the top view.

Figure 5B:
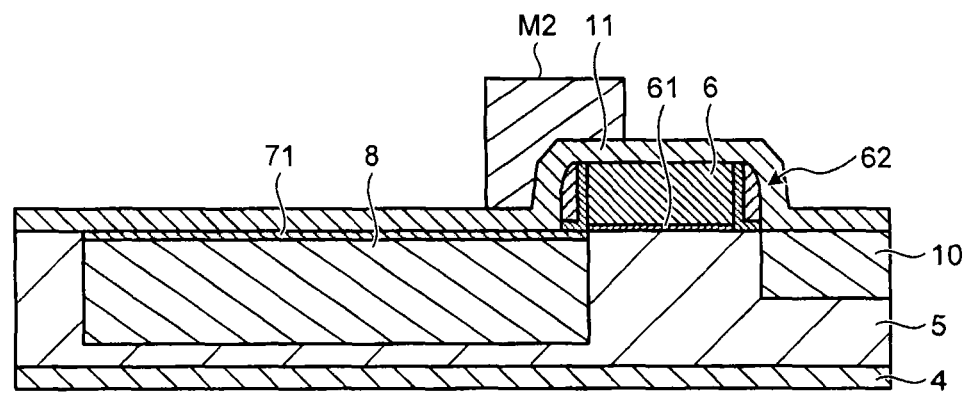

Subsequently, as illustrated in FIG. 5B, the insulating film 11 is formed on the entire surface of the structure illustrated in FIG. 5A. As the insulating film 11, a silicon oxide film or a silicon nitride, with a thickness of approximately 10 nm, film is formed.

Figure 6B:
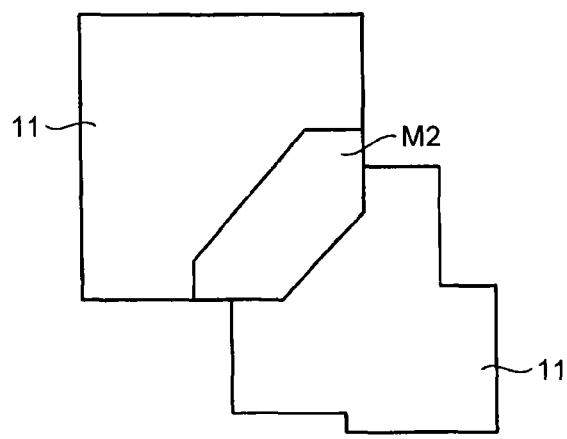

After this, as illustrated in FIG. 5B and FIG. 6B, a resist M2 is formed on the insulating film 11 in a part, including the boundary between the TG 6 and the charge storage area 8 in the top view and covering both of a part of the TG 6 on the side of the charge storage area 8 and the upper part of the charge storage area 8 on the side of the TG 6.

Figure 5C:
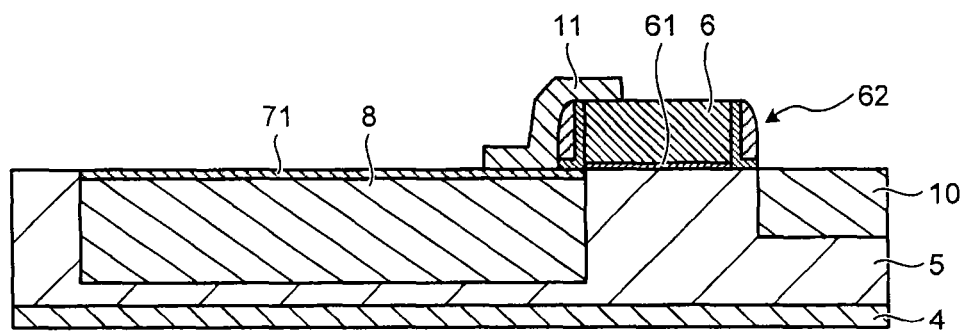
Figure 6C:
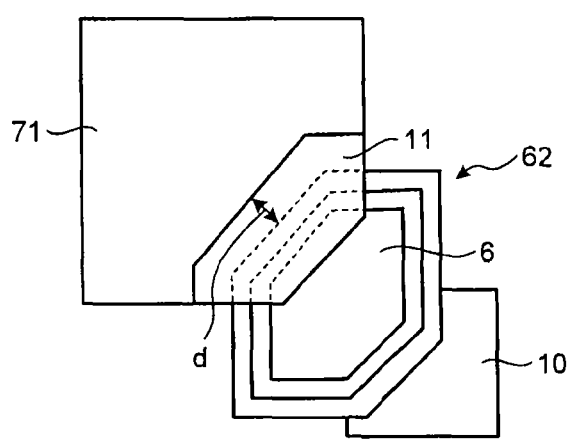

Any unnecessary parts of the insulating film 11 are removed through an etching process, using the resist M2 as a mask, thereby forming the structure illustrated in FIG. 5C and FIG. 6C. This results in forming the insulating film 11 which has been patterned. In this patterning, one end of the film 11 extends at least from the circumference surface of the sidewall on the side of the charge storage area 8 to a position partially covering the upper part of the charge storage area 8, in the top view.

In this case, a distance "d", from the circumference surface of the sidewall 62 on the side of the charge storage area 8 to a position partially covering the upper part of the charge storage area 8, is approximately from 10 nm to 40 nm. Because the second P-type layer 72 (see FIGS. 7A to 7C) will be formed afterwards, the insulating film 11 is formed to cover from the circumference surface of the sidewall 62 on the side of the charge storage area 8 to the upper part of the charge storage area 8, instead of covering the entire surface of the charge storage area 8.

That is, the insulating film 11 is not formed on the entire surface of the charge storage area 8, to form the second P-type layer 72 afterwards. As a result, it is possible to attain the suppression characteristic of suppressing white defects and afterimages, by the second P-type layer 72 to be formed afterwards.

At this time, the insulating film 11 is formed in a manner that the other end thereof extends from the circumference surface of the sidewall 62 on the charge storage area 8 to at least a part of the upper surface of the TG 6, in the top view.

To suppress the white defects and afterimages, the insulating film 11 of FIG. 5C exists on the upper surface of the first P-type layer 71. The insulating film 11 extends up to the upper surface of the TG 6 to have a large area of the insulating film 11, thereby easily performing patterning of the insulating film 11.

Figure 7A:
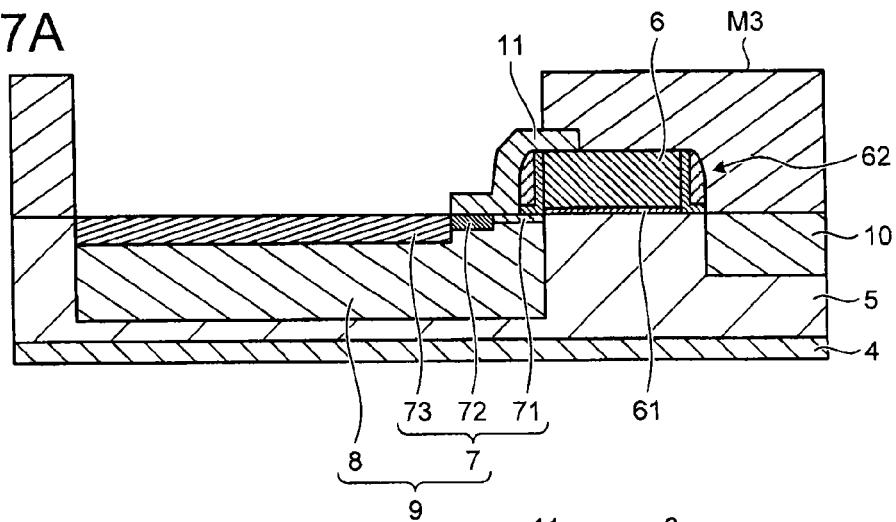
FIGS. 7A to 7C are explanatory diagrams showing a manufacturing method of the CMOS sensor according to the embodiment.

Subsequently, as illustrated in FIG. 7A, the positive hole storage layer 7 is formed by forming the second P-type layer 72 and the third P-type layer 73. Specifically, a resist M3 is formed to cover a part excluding the upper part of the charge storage area 8, on the upper surface of the structure illustrated in FIG. 5C. The P-type impurities are implanted from above, while using the resist M3 as a mask. After this, the annealing process is performed, thereby forming the positive hole storage layer 7 to form the PD 9.

In this case, the ion implantation is performed at a higher energy level than that for forming the first P-type layer 71. This results in forming the third P-type layer 73 deeper than the first P-type layer 71 and with a higher concentration of the P-type impurities than that. The amount of implantation of P-type impurities and the energy level of the second P-type layer 72 can be limited by the insulating film 11. As a result, the second P-type layer 72 is shallower than the third P-type layer 73 and deeper than the first P-type layer 71, has a lower concentration of the P-type impurities than that of the third P-type layer 73, and has a higher concentration of the P-type impurities than the first P-type layer 71.

The relative relationship of the depth or impurity concentration between the first P-type layer 71 and the second P-type layer 72 can be adjusted in accordance with the energy level applied to the impurity ions to be implanted. The relative relationship of the depth or impurity concentration between the third P-type layer 73 and the second P-type layer 72 can be adjusted by changing the thickness of the insulating film 11.

As described, the positive hole storage layer 7 is formed to be shallower as nearer to the TG 6, and to have a lower concentration of the P-type impurities. Accordingly, in the pixel unit 2, the white defects and afterimages can be suppressed in the picked up image.

Figure 7B:
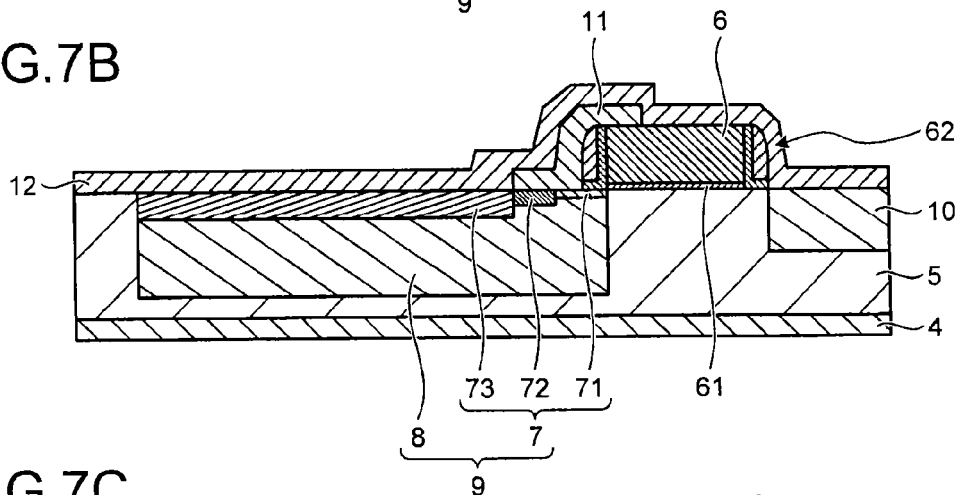

Subsequently, after separating the resist M3, as illustrated in FIG. 7B, the antireflection film 12 is formed on the entire surface including the PD9, the TG 6 and the FD 10. In this case, as an antireflection film, a silicon nitride film with a thickness of approximately 10 nm is formed.

In this case, the antireflection film 12 has been formed on the entire surface of the structure including the insulating film 11. However, the insulating film 11 may be removed before forming the antireflection film 12. If the insulating film 11 is removed before forming the antireflection film 12, the flatness of the constituent elements (the interlayer insulating film 13 formed in the upper layer) can be improved afterwards.

Figure 7C:
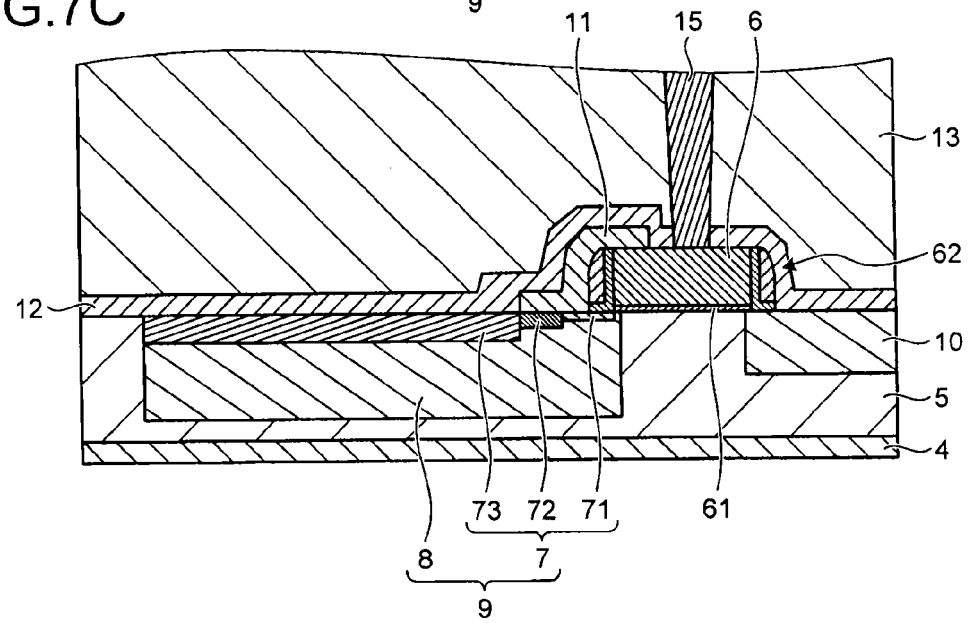

As illustrated in FIG. 7C, the interlayer insulating film 13, the contact plug 15, and the multilayer wiring 14 (see FIG. 2) are formed on the antireflection film 12, using a known damascene technique or a dual damascene technique. After this, as illustrated in FIG. 2, the color filter 16 and the micro lens 17 are sequentially laminated to form the pixel unit 2 in a position overlapping with the top view PD 9 on the upper surface of the interlayer insulating film 13, to manufacture the CMOS sensor 1.

As described above, in the manufacturing method of the solid-state image pickup device according to the embodiment, the transfer gate electrode is formed in a predetermined position on the upper surface of the first conductive semiconductor area through the gate insulating film. The transfer gate electrode transfers the charges which have been photoelectrically converted by the photoelectric conversion device to the floating diffusion area.

A second conductive charge storage area is formed in an area adjacent to the top view transfer gate electrode in the first conductive semiconductor area, to form sidewalls on the side surfaces of the transfer gate electrode. Note that the second conductive charge storage area is formed to store those charges which have been photoelectrically converted by the photoelectric conversion device.

Further, an insulating film is formed to extend from the circumference surface of the sidewall on the side of the top view charge storage area up to a position partially covering the upper part of the charge storage area. In addition, the first conductive impurities are implanted from above into the charge storage area whose upper part is partially covered with the insulating film, to form the first conductive charge storage layer on the upper surface of the charge storage area.

According to the manufacturing method of the solid-state image pickup device according to the embodiment, it is possible to manufacture a solid-state image pickup device in which the white defects and afterimages can be suppressed in the picked up image.

Figure 8A:
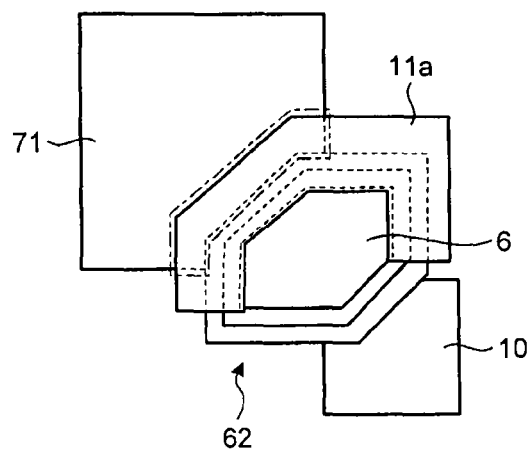
FIGS. 8A to 8C are explanatory diagrams showing a modification form as seen from a top surface view of an insulating film according to the embodiment.
Figure 8B:
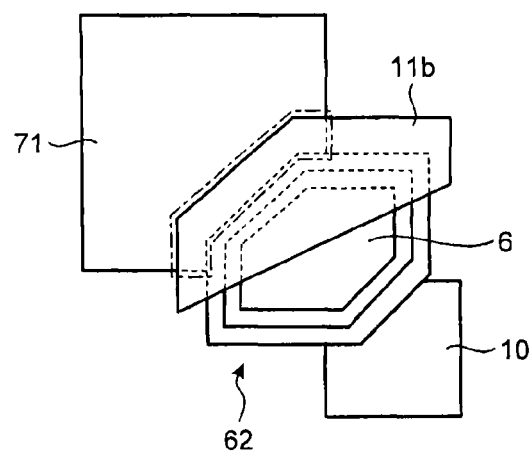
Figure 8C:
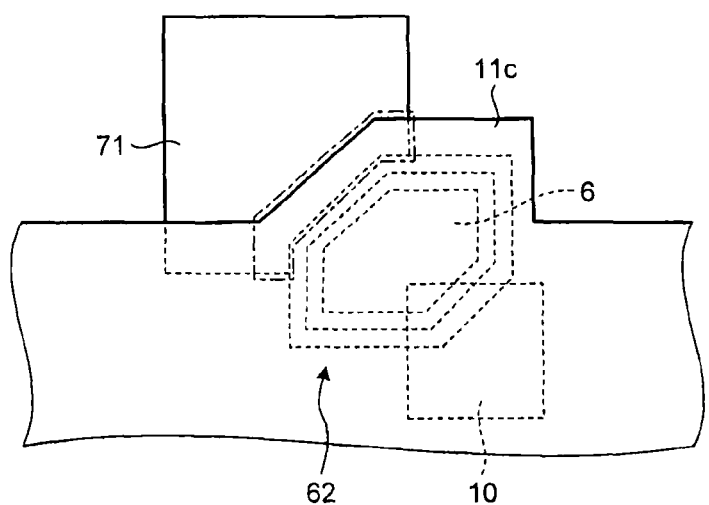

The form of the insulating film 11 illustrated in FIG. 6C is made only by way of example, and various changes may be made thereto. FIGS. 8A to 8C are explanatory diagrams showing a modification of the form of the insulating film in the top view. In FIGS. 8A to 8C, the same constituent elements as those of the FIGS. 6A to 6C are identified by the same reference symbols as those of FIGS. 6A to 6C.

For example, as illustrated in FIG. 8A, an insulating film 11a may be formed in place of the insulating film 11, includes at least the boundary between the sidewall 62 and the first P-type layer 71 in the top view, and surrounds the upper surface of the TG 6 in a C-shape in the top view.

As illustrated in FIG. 8B, an insulating film 11b may be formed in place of the insulating film 11, includes at least the boundary between the sidewall 62 and the first P-type layer 71 in the top view, and covers half of the first P-type layer 71 on the upper surface of the sidewall 62 and the TG 6.

As illustrated in FIG. 8C, an insulating film 11c may be formed in place of the insulating film 11, includes at least the boundary between the sidewall 62 and the first P-type layer 71 in the top view, and covers the entire surface of the sidewall 62, the TG 6, and the FD 10.

When the insulating films 11a, 11b, and 11c illustrated in FIGS. 8A to 8C are formed, the second P-type layer 72 may be formed right below an area surrounded by the frame with dashed-dotted line in FIGS. 8A to 8C. The third P-type layer 73 may be formed right below the first P-type layer 71 which is not covered with the insulating films 11a, 11b, and 11c.

When the insulating films 11a, 11b, and 11c illustrated in FIGS. 8A to 8C are formed, it is possible to manufacture a solid-state image pickup device, in which white defects and afterimages can be suppressed in the picked up image.

Figure 9:
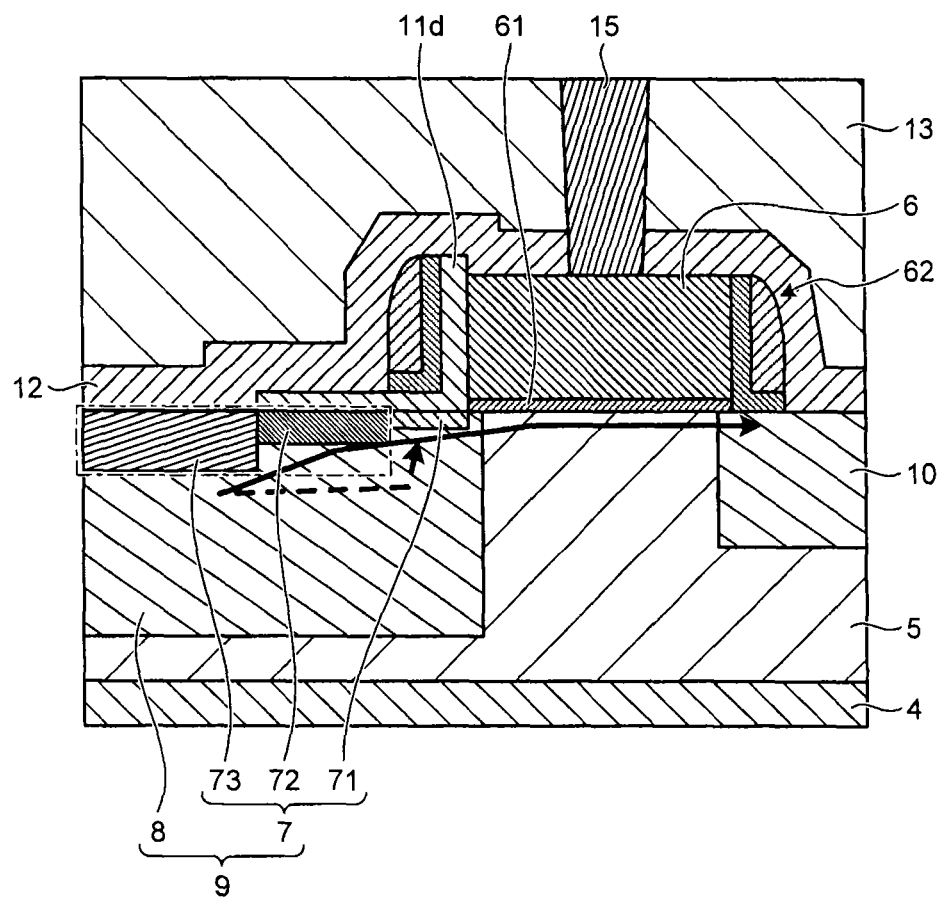
FIG. 9 is an explanatory diagram showing a part of a solid-state image pickup device which has been manufactured in accordance with the manufacturing method according to a modification of the embodiment.

In the above-described embodiment, after the sidewall 62 is formed, the insulating film 11 is formed. However, the film may be formed before forming the sidewall 62. FIG. 9 is an explanatory diagram showing a part of the solid-state image pickup device which is manufactured using a manufacturing method according to a modification of the embodiment.

The part of the solid-state image pickup device illustrated in FIG. 9 corresponds to the part illustrated in FIG. 3. Thus, in FIG. 9, the constituent elements having the same functions as those of the constituent elements of FIG. 3 are identified by the same reference symbols illustrated in FIG. 3.

In the manufactured solid-state image pickup device illustrated in FIG. 9, the insulating film 11d is formed before forming the sidewall 62. For example, after forming the structure illustrated in FIG. 4A, the charge storage area 8, the first P-type layer 71, the FD 10, and the insulating film 11d are sequentially formed. After the sidewall 62 is formed, the second P-type layer 72 and the third P-type layer 73 are sequentially formed. Then, the device is manufactured in accordance with the same manufacturing steps illustrated in and after FIG. 7B.

When the solid-state image pickup device is manufactured in accordance with the manufacturing method, as illustrated in FIG. 9, the positive hole storage layer 7 may be formed on the upper surface part of the charge storage area 8. This positive hole storage layer 7 is shallower, and has a lower concentration of the P-type impurities, as nearer to the TG 6.

In the solid-state image pickup device manufactured without forming the insulating film 11d illustrated in FIG. 9, the second P-type layer 72 is formed deep as illustrated with the dashed-dotted line in FIG. 9. Thus, those electrons stored in the charge storage area 8 are transferred from the charge storage area 8 to the FD 10 through the lower layer part of the charge storage area 8 whose potential barrier is relatively high, as illustrated with a dotted arrow.

In contrast, in the solid-state image pickup device illustrated in FIG. 9, the charges can be transferred from the charge storage area 8 to the FD 10 through the upper layer part of the charge storage area 8 whose potential barrier is relatively low, as illustrated with a solid arrow. Therefore, according to the solid-state image pickup device illustrated in FIG. 9, it is possible to avoid the occurrence of afterimages due to the electrons remaining in the charge storage area 8 without being transferred to the FD 10.

In the above-described embodiment, the descriptions have been made to the surface irradiation CMOS as an example of the solid-state image pickup device. However, the manufacturing method of the solid-state image pickup device according to this embodiment is applicable to a back-surface irradiation CMOS image sensor.

While a certain embodiment has been described, the embodiment has been presented by way of example only, and is not intended to limit the scope of the inventions. Indeed, the novel embodiment described herein may be embodied in a variety of other forms; furthermore, various omissions, substitutions and changes in the form of the embodiment described herein may be made without departing from the spirit of the inventions. The accompanying claims and their equivalents are intended to cover such forms or modifications as would fall within the scope and spirit of the inventions.

What is claimed is:

1. A solid-state image pickup device, comprising:
   a semiconductor area which is provided on a semiconductor substrate;
   a transfer gate electrode which is provided in a predetermined position on an upper surface of the semiconductor area through a gate insulating film;

a charge storage area which is provided in an area adjacent to the transfer gate electrode in the semiconductor area, and stores charges photoelectrically converted by a photoelectric conversion device;

a floating diffusion area which is provided in an area opposed to the charge storage area across the transfer gate electrode in the semiconductor area;

a sidewall which is provided on a side surface of the transfer gate electrode;

an insulating film which extends from a circumference surface of the sidewall on a side of the charge storage area to a position partially covering an upper part of the charge storage area; and a charge storage layer which is provided in an upper surface part of the charge storage area, the charge storage layer having a different depth, which is shallower in a portion closer to the transfer gate electrode than in a portion away from the transfer gate electrode.

2. The solid-state image pickup device according to claim 1, wherein the insulating film extends from the circumference surface of the sidewall on the side of the charge storage area to at least a part of an upper surface of the transfer gate electrode.

3. The solid-state image pickup device according to claim 1, wherein the insulating film is provided between a side surface of the transfer gate electrode on a side of the charge storage area and the sidewall, and between a bottom surface of the sidewall and the upper surface of the charge storage area.

4. The solid-state image pickup device according to claim 1, wherein the insulating film is a silicon oxide film.

5. The solid-state image pickup device according to claim 1, wherein the insulating film is a silicon nitride film.

6. The solid-state image pickup device according to claim 1, wherein the insulating film extends at least 10 nm or more from the circumference surface of the sidewall on the side of the charge storage area to the upper part of the charge storage area.

7. The solid-state image pickup device according to claim 1, wherein the insulating film is provided to cover a boundary between the sidewall and the charge storage area.

8. The solid-state image pickup device according to claim 1, wherein the insulating film surrounds an upper surface of the transfer gate electrode in an approximately C-shape in a top view.

9. The solid-state image pickup device according to claim 1, wherein the insulating film covers entire upper surfaces of the sidewall, the transfer gate electrode, and the floating diffusion area.

10. The solid-state image pickup device according to claim 1, further comprising:

an antireflection film which covers upper surfaces of the transfer gate electrode, the floating diffusion area, the sidewall, the insulating film, and the charge storage layer;

an interlayer insulating film which is provided on the antireflection film;

a color filter which is provided on an upper surface of the interlayer insulating film, the color filter being provided in a position in which the color filter overlaps with the photoelectric conversion device in a top view; and a micro lens which is provided on an upper surface of the color filter.

11. The solid-state image pickup device according to claim 1, wherein the nearer the charge storage layer is positioned to the transfer gate electrode, the lower a concentration of impurities.

* * * * *